(12) United States Patent
Shimizu

(10) Patent No.: US 10,651,318 B2
(45) Date of Patent: May 12, 2020

(54) SEMICONDUCTOR DEVICE AND METHOD OF MANUFACTURING THE SAME

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/111,788

(22) Filed: Aug. 24, 2018

(65) Prior Publication Data

US 2019/0296156 A1 Sep. 26, 2019

(30) Foreign Application Priority Data

Mar. 21, 2018 (JP) ................. 2018-053607

(51) Int. Cl.
| | |
|---|---|
| *H01L 29/872* | (2006.01) |
| *H01L 29/16* | (2006.01) |
| *H01L 29/36* | (2006.01) |
| *H01L 29/66* | (2006.01) |
| *H01L 21/04* | (2006.01) |

(52) U.S. Cl.
CPC .......... *H01L 29/872* (2013.01); *H01L 21/046* (2013.01); *H01L 21/0485* (2013.01); *H01L 21/0495* (2013.01); *H01L 29/1608* (2013.01); *H01L 29/36* (2013.01); *H01L 29/6606* (2013.01)

(58) Field of Classification Search
CPC .. H01L 29/872; H01L 21/046; H01L 21/0485
See application file for complete search history.

(56) References Cited

U.S. PATENT DOCUMENTS

| 8,994,034 B2 | 3/2015 | Shimizu et al. |
|---|---|---|
| 9,324,826 B2 | 4/2016 | Shimizu et al. |
| 9,431,246 B2 | 8/2016 | Shimizu |

(Continued)

FOREIGN PATENT DOCUMENTS

| JP | 2013-58668 | 3/2013 |
|---|---|---|
| JP | 2014-78727 | 5/2014 |

(Continued)

OTHER PUBLICATIONS

U.S. Pat. No. 8,994,034 B2, Feb. 24, 2012, 2013/0062623 A1, Tatsuo Shimizu, et al.

(Continued)

*Primary Examiner* — Errol V Fernandes
(74) *Attorney, Agent, or Firm* — Oblon, McClelland, Maier & Neustadt, L.L.P.

(57) ABSTRACT

A semiconductor device according to an embodiment includes a first electrode; a second electrode; a silicon carbide layer disposed between the first electrode and the second electrode; a first n-type silicon carbide region disposed in the silicon carbide layer; and a first nitrogen region disposed in the silicon carbide layer, the first nitrogen region disposed between the first n-type silicon carbide region and the first electrode, and the first nitrogen region having a first nitrogen concentration higher than a first n-type impurity concentration of the first n-type silicon carbide region.

17 Claims, 14 Drawing Sheets

(56) References Cited

U.S. PATENT DOCUMENTS

2014/0183561 A1* 7/2014 Shimizu ............ H01L 21/26506
257/77

FOREIGN PATENT DOCUMENTS

| JP | 2014-127709 | 7/2014 |
|----|-------------|--------|
| JP | 2015-146450 | 8/2015 |

OTHER PUBLICATIONS

U.S. Pat. No. 9,324,826 B2, Aug. 24, 2011, 2012/0199846 A1, Tatsuo Shimizu, et al.

Tanimoto, S., et al. "Toward a better understanding of Ni-based ohmic contacts on SiC", Materials Science Forum vols. 679-680, 2011, 4 pages.

Kawahara, K., et al. "Detection and depth analyses of deep levels generated by ion implantation in n- and p-type 4H-SiC", Journal of Applied Physics 106, 2009, 7 pages.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2018-053607, filed on Mar. 21, 2018, the entire contents of which are incorporated herein by reference.

FIELD

Embodiments described herein relate generally to a semiconductor device and a method of manufacturing the same.

BACKGROUND

Silicon carbide (SiC) is expected as a material for next generation semiconductor devices. Silicon carbide has excellent physical properties of the band gap of about 3 times, the breakdown field strength of about 10 times, and the thermal conductivity of about 3 times those of silicon (Si). By utilizing the characteristics, a semiconductor device operable at a high temperature with a low loss can be realized. However, for example, in the case of forming a Schottky barrier diode (SBD) using silicon carbide, there is a problem that a Schottky barrier height becomes unstable.

DETAILED DESCRIPTION

Figure 1:
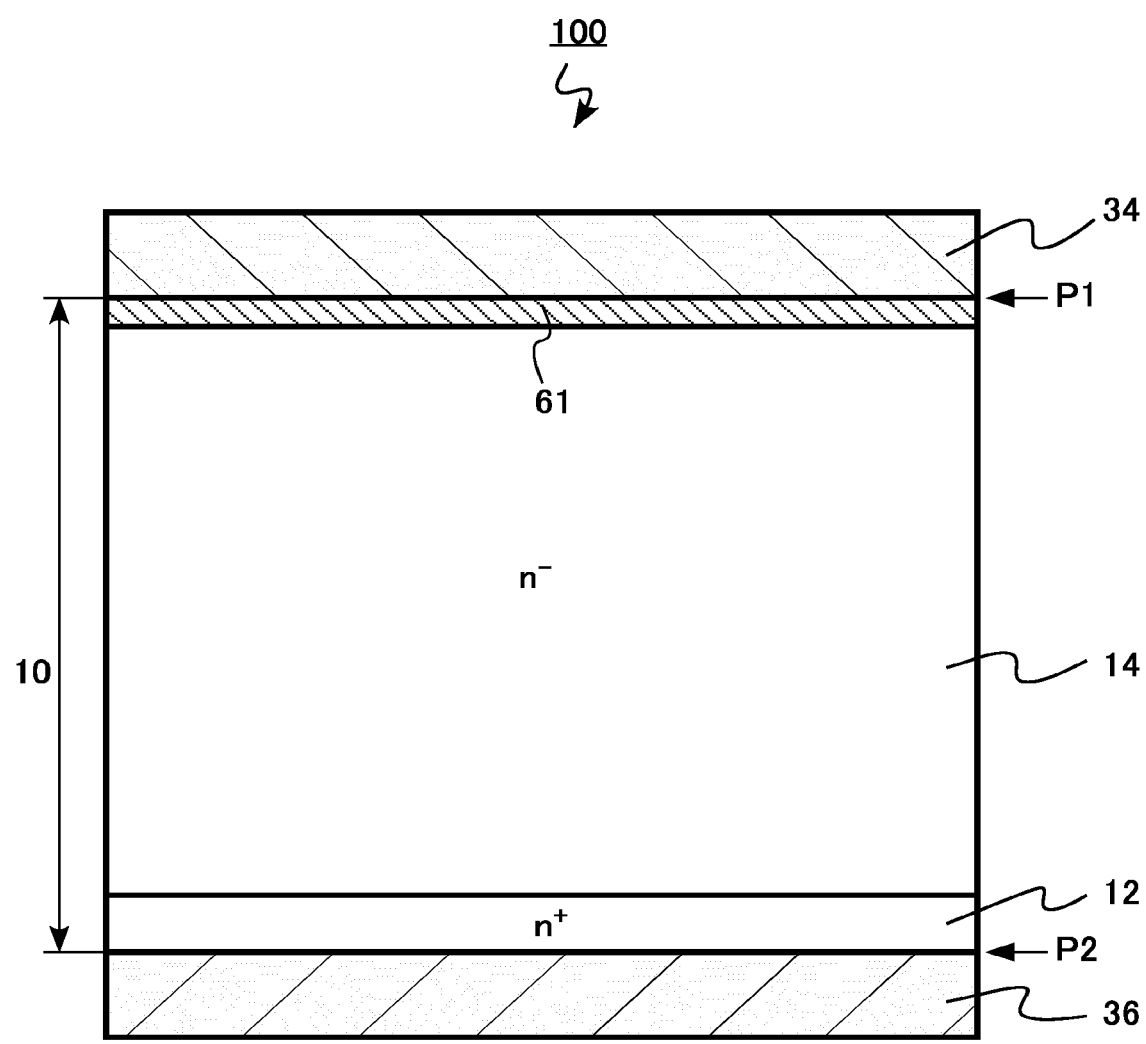
FIG. 1 is a schematic sectional view of a semiconductor device according to a first embodiment.

A semiconductor device according to an embodiment includes a first electrode; a second electrode; a silicon carbide layer disposed between the first electrode and the second electrode; a first n-type silicon carbide region disposed in the silicon carbide layer; and a first nitrogen region disposed in the silicon carbide layer, the first nitrogen region disposed between the first n-type silicon carbide region and the first electrode, and the first nitrogen region having a first nitrogen concentration higher than a first n-type impurity concentration of the first n-type silicon carbide region.

Hereinafter, embodiments of the present disclosure will be described with reference to the drawings. Note that, in the following description, the same or similar members and the like are denoted by the same reference numerals, and description of once described members and the like is omitted as appropriate.

Further, in the following description, the notations $n^+$, n, $n^-$ and $p^+$, p, $p^-$ represent relative height of impurity concentrations in the conductivity types. That is, $n^+$ indicates that an n-type impurity concentration is relatively higher than that of n, and $n^-$ indicates that the n-type impurity concentration is relatively lower than that of n. Further, $p^+$ indicates that a p-type impurity concentration is relatively higher than that of p, and $p^-$ indicates that the p-type impurity concentration is relatively lower than that of p. Note that the $n^+$-type and $n^-$-type are sometimes simply described as n-type, $p^+$-type and $p^-$-type are sometimes simply described as p-type.

First Embodiment

A semiconductor device according to a first embodiment includes a first electrode; a second electrode; a silicon carbide layer disposed between the first electrode and the second electrode; a first n-type silicon carbide region disposed in the silicon carbide layer; and a first nitrogen region disposed in the silicon carbide layer, the first nitrogen region disposed between the first n-type silicon carbide region and the first electrode, and the first nitrogen region having a first nitrogen concentration higher than a first n-type impurity concentration of the first n-type silicon carbide region.

FIG. 1 is a schematic sectional view of a semiconductor device according to a first embodiment. The semiconductor device of the first embodiment is an SBD 100.

The SBD 100 includes a silicon carbide layer 10, a cathode region 12 (a second n-type silicon carbide region), a drift region 14 (a first n-type silicon carbide region), an anode electrode 34 (first electrode), a cathode electrode 36 (second electrode), and a first nitrogen region 61. The cathode region 12, the drift region 14, and the first nitrogen region 61 are provided in the silicon carbide layer 10.

The silicon carbide layer 10 is single-crystal SiC. The silicon carbide layer 10 is, for example, 4H—SiC.

Figure 2:
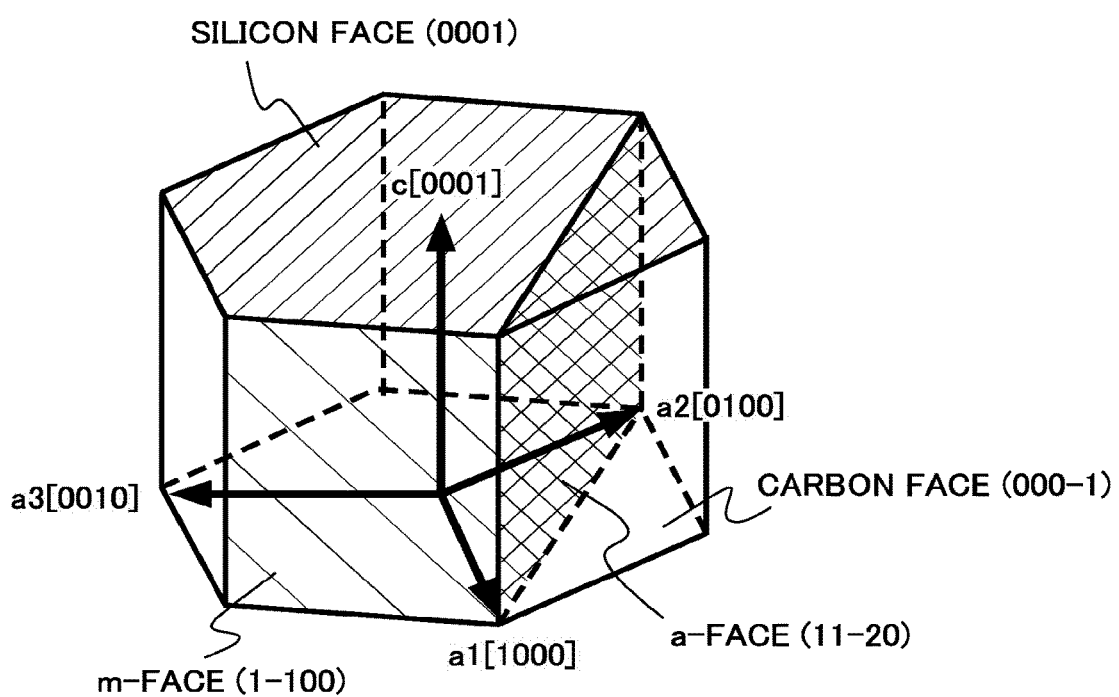
FIG. 2 is a view illustrating a crystal structure of a silicon carbide semiconductor of the first embodiment.

FIG. 2 is a view illustrating a crystal structure of a silicon carbide semiconductor. A typical crystal structure of the silicon carbide semiconductor is a hexagonal crystal system such as 4H—SiC. One of faces normal to a c-axis along an axial direction of a hexagonal prism (a top face of the hexagonal prism) is a (0001) face. A face equivalent to the (0001) face is referred to as a silicon face and is described as {0001} face. Silicon (Si) is arrayed on the silicon face.

The other of the faces normal to the c-axis along the axial direction of the hexagonal prism (a top face of the hexagonal prism) is a (000-1) face. A face equivalent to the (000-1) face is referred to as a carbon face and is described as {000-1} face. Carbon (C) is arrayed on the carbon face.

Meanwhile, a side face (column face) of the hexagonal prism is an m-face that is a face equivalent to a (1-100) face, that is, a {1-100} face. Further, a face passing through a pair of ridgelines not adjacent to each other is an a-face that is a face equivalent to a (11-20) face, that is, a {11-20} face. Both silicon (Si) and carbon (C) are arrayed on the m-face and the a-face.

The silicon carbide layer 10 has a first plane P1 (front surface) and a second plane P2 (back surface). The front surface P1 of the silicon carbide layer 10 is, for example, a plane inclined by from 0° to 8° with respect to the (0001) face. The (0001) face is called silicon face. The back surface P2 of the silicon carbide layer 10 is, for example, a plane inclined by from 0° to 8° with respect to the (000-1) face.

The silicon carbide layer 10 is provided between the anode electrode 34 (first electrode) and the cathode electrode 36 (second electrode).

Figure 3:
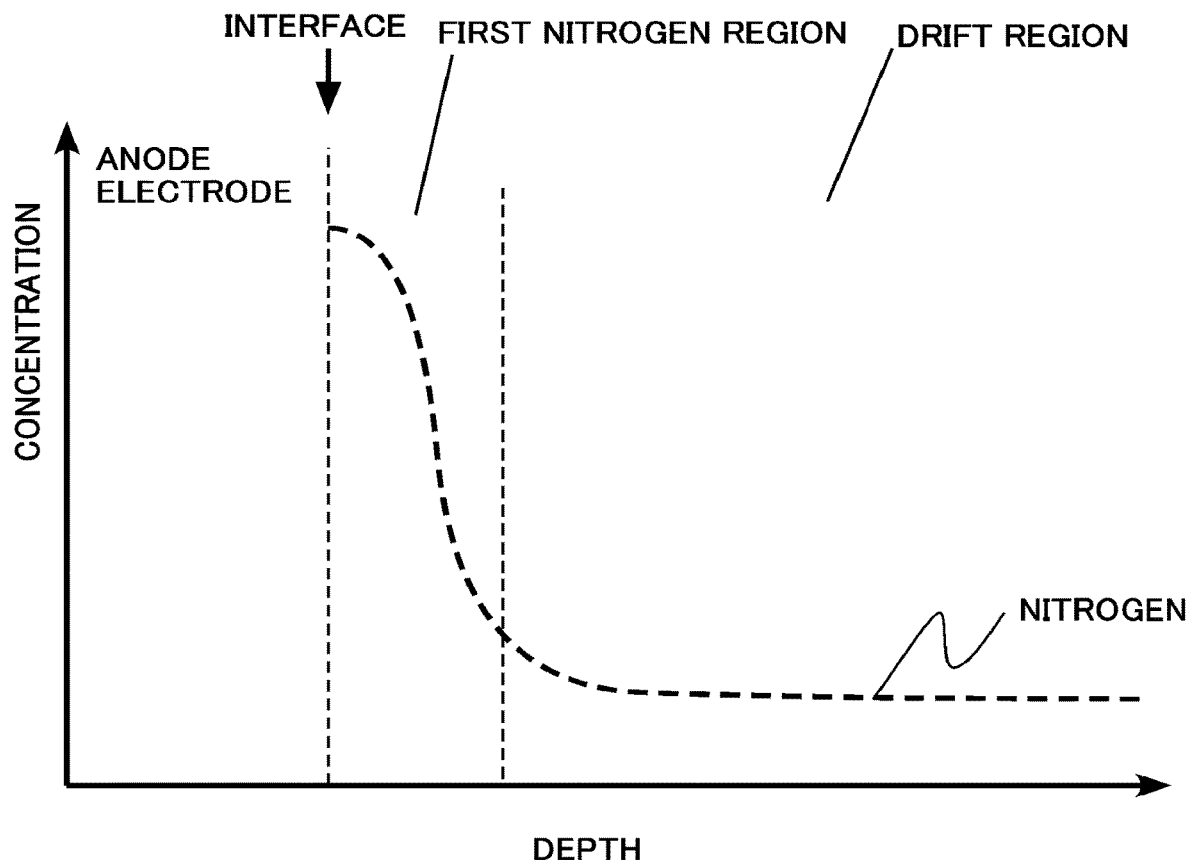
FIG. 3 is a diagram illustrating concentration distribution of an element of the semiconductor device of the first embodiment.

FIG. 3 is a diagram illustrating concentration distribution of an element of the semiconductor device of the first embodiment. FIG. 3 illustrates the concentration distribution of nitrogen in a cross section including the silicon carbide layer 10 and the anode electrode 34.

The cathode region 12 is n$^+$-type SiC. The cathode region 12 is provided between the drift region 14 and the cathode electrode 36. The cathode region 12 contains, for example, nitrogen (N) as an n-type impurity. An impurity concentration of the n-type impurity (second n-type impurity concentration) of the cathode region 12 is higher than an impurity concentration of the n-type impurity (first n-type impurity concentration) of the drift region 14. The impurity concentration of the n-type impurity (second n-type impurity concentration) of the cathode region 12 is, for example, equal to or higher than $1\times10^{18}$ cm$^{-3}$ and equal to or lower than $1\times10^{21}$ cm$^{-3}$.

The drift region 14 is n$^-$-type SiC. The drift region 14 is provided on the cathode region 12. The drift region 14 is n$^-$-type SiC. The drift region 14 contains, for example, nitrogen as an n-type impurity.

The impurity concentration of the n-type impurity (first n-type impurity concentration) of the drift region 14 is lower than the impurity concentration of the n-type impurity (second n-type impurity concentration) of the cathode region 12. The impurity concentration of the n-type impurity in the drift region 14 is, for example, equal to or higher than $1\times10^{15}$ cm$^{-3}$ and equal to or lower than $2\times10^{16}$ cm$^{-3}$.

The drift region 14 is, for example, an epitaxially grown layer of SiC formed on the cathode region 12 by epitaxial growth. The thickness of the drift region 14 is, for example, from 5 μm to 100 μm.

The anode electrode 34 is electrically connected to the drift region 14. The anode electrode 34 is provided on the side of the front surface P1 of the silicon carbide layer 10. The anode electrode 34 is in contact with the silicon carbide layer 10.

The anode electrode 34 is in contact with the first nitrogen region 61. The junction between the anode electrode 34 and the first nitrogen region 61 is a Schottky junction.

The anode electrode 34 is, for example, a metal or a metal compound. The anode electrode 34 is constituted by, for example, lamination of a barrier metal layer of Ni (nickel) and a metal layer of aluminum on the barrier metal layer. The barrier metal layer of nickel and the silicon carbide layer 10 may react to form nickel silicide (NiSi, Ni$_2$Si, or the like). The barrier metal layer of nickel and the metal layer of aluminum may form an alloy by reaction.

The cathode electrode 36 is electrically connected to the cathode region 12. The cathode electrode 36 is provided on the side of the back surface P2 of the silicon carbide layer 10. The cathode electrode 36 is in contact with the silicon carbide layer 10.

The cathode electrode 36 is in contact with the cathode region 12. The junction between the cathode electrode 36 and the cathode region 12 is an ohmic junction.

The cathode electrode 36 is, for example, a metal or a metal compound. The cathode electrode 36 is, for example, nickel. Nickel may react with the silicon carbide layer 10 to form nickel silicide (NiSi, Ni$_2$Si, or the like).

The first nitrogen region 61 is provided in the silicon carbide layer 10. The first nitrogen region 61 is provided between the drift region 14 and the anode electrode 34. The first nitrogen region 61 is provided adjacent to the anode electrode 34. The first nitrogen region 61 is in contact with the anode electrode 34.

The first nitrogen region 61 is provided adjacent to the front surface P1 of the silicon carbide layer 10. The first nitrogen region 61 is in contact with the front surface P1 of the silicon carbide layer 10.

The first nitrogen region 61 contains nitrogen (N).

The first nitrogen region 61 is n-type silicon carbide containing nitrogen (N).

A nitrogen concentration (first nitrogen concentration) of the first nitrogen region 61 is higher than the impurity concentration of the n-type impurity (first n-type impurity concentration) of the drift region 14. For example, in the case where the n-type impurity of the drift region 14 is nitrogen, the nitrogen concentration of the first nitrogen region 61 is higher than a nitrogen concentration of the drift region 14.

The nitrogen concentration (first nitrogen concentration) of the first nitrogen region 61 is, for example, equal to or higher than $1\times10^{17}$ cm$^{-3}$ and equal to or lower than $1\times10^{22}$ cm$^{-3}$.

As illustrated in FIG. 3, the concentration distribution of nitrogen of the first nitrogen region 61 has a peak at an interface with the anode electrode 34, for example. A peak concentration of nitrogen of the first nitrogen region 61 is, for example, equal to or higher than $1\times10^{17}$ cm$^{-3}$ and equal to or lower than $1\times10^{22}$ cm$^{-3}$. A full width at half maximum of the concentration distribution of nitrogen of the first nitrogen region 61 is, for example, from 0.5 nm to 5 nm.

Figure 4:
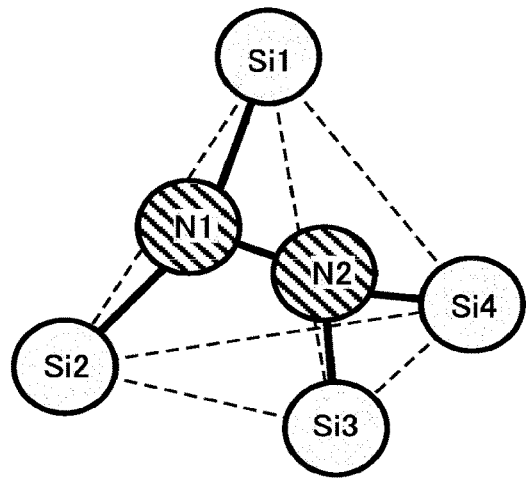
FIG. 4 is an explanatory diagram of a first nitrogen region of the semiconductor device of the first embodiment.

FIG. 4 is an explanatory diagram of the first nitrogen region of the semiconductor device of the first embodiment.

The first nitrogen region 61 has a structure in which two nitrogen atoms exist at a carbon position of a silicon carbide lattice, as illustrated in FIG. 4. In other words, the first nitrogen region 61 has a structure in which two nitrogen atoms are contained in a carbon vacancy Vc of the silicon carbide lattice. Hereinafter, this structure is referred to as a VcNN structure.

As illustrated in FIG. 4, the VcNN structure includes a first nitrogen atom N1 bonded to two silicon atoms Si1 and Si2 and a second nitrogen atom N2 bonded to the first nitrogen atom N1 and bonded to two silicon atoms Si3 and Si4.

Since the first nitrogen region 61 has the VcNN structure, the density of the carbon vacancies Vc of the silicon carbide layer 10 is reduced. Note that nitrogen in the VcNN structure does not function as a dopant. The nitrogen in the VcNN structure is inert nitrogen.

A bonding state of nitrogen in the silicon carbide layer 10 and positions of nitrogen in the silicon carbide lattice can be determined by an X-ray photoelectron spectroscopy (XPS), for example. The distribution of nitrogen, the n-type impurity, and the p-type impurity in the silicon carbide layer 10 can be measured by a secondary ion mass spectrometry (SIMS), for example. Further, whether a region in the silicon carbide layer 10 is p-type or n-type can be determined by a scanning capacitance microscopy (SCM), for example.

Next, a method of manufacturing a semiconductor device of the first embodiment will be described.

A method of manufacturing a semiconductor device according to the first embodiment includes performing first heat treatment to a silicon carbide layer to form a first nitrogen region containing nitrogen, the first heat treatment being performed at a temperature between 1300° C. and 1500° C. in an $N_2$ gas with an oxygen partial pressure of 0.1 ppm or less, the silicon carbide layer having a first plane and a second plane, the silicon carbide layer having a first n-type silicon carbide region, and the first heat treatment being performed with the first plane exposed; forming a first electrode on the first plane after the performing the first heat treatment; and forming a second electrode on the second plane after the performing the first heat treatment. The method of manufacturing a semiconductor device further includes forming a thermal oxide film on the first plane before the first heat treatment, and removing the thermal oxide film before the first heat treatment.

Figure 5:
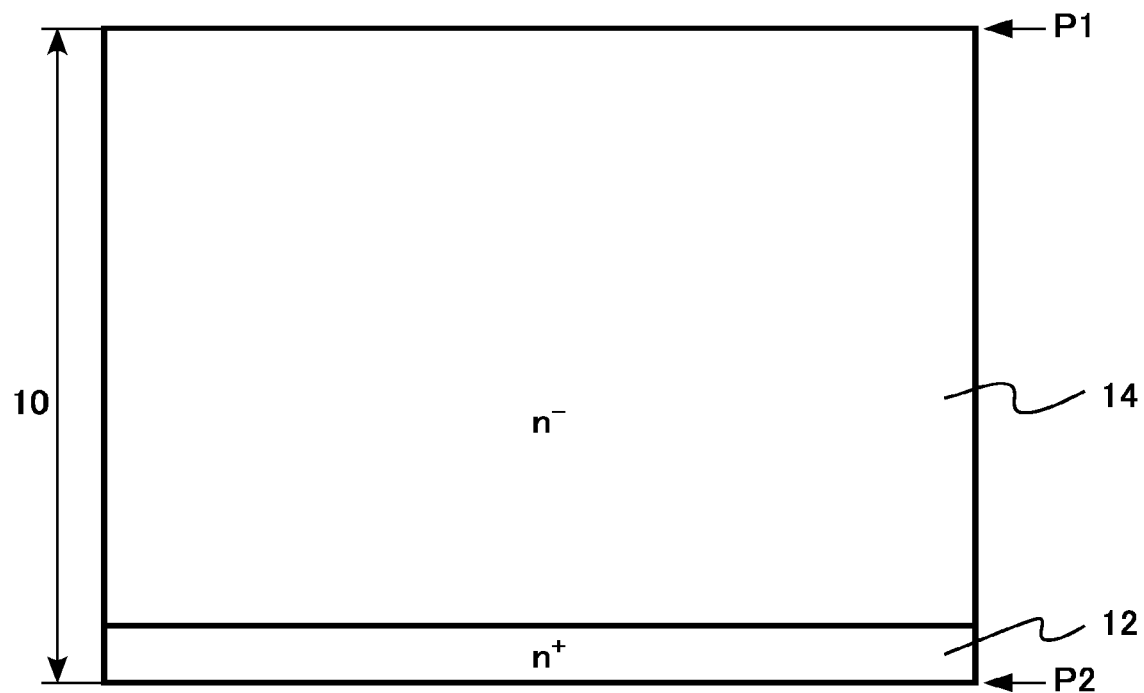
FIG. 5 is a schematic sectional view illustrating the semiconductor device in the middle of manufacturing in a method of manufacturing the semiconductor device of the first embodiment.
Figure 6:
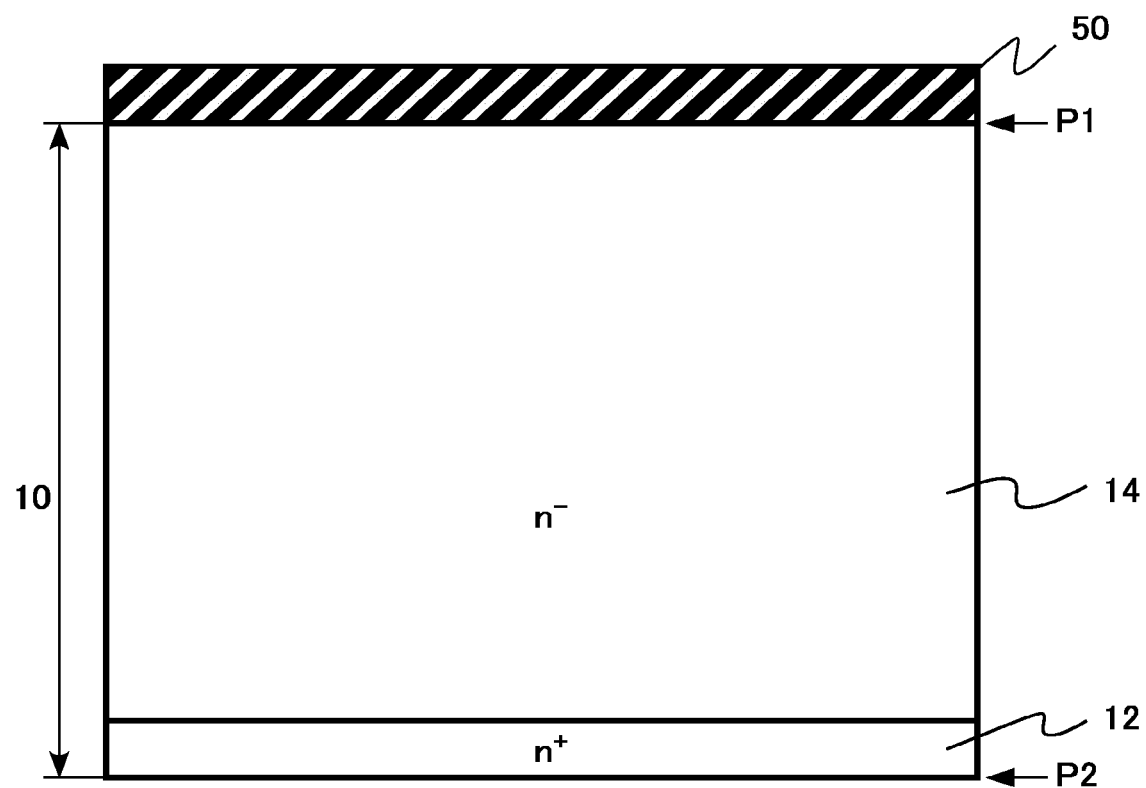
FIG. 6 is a schematic sectional view illustrating the semiconductor device in the middle of manufacturing in the method of manufacturing the semiconductor device of the first embodiment.
Figure 7:
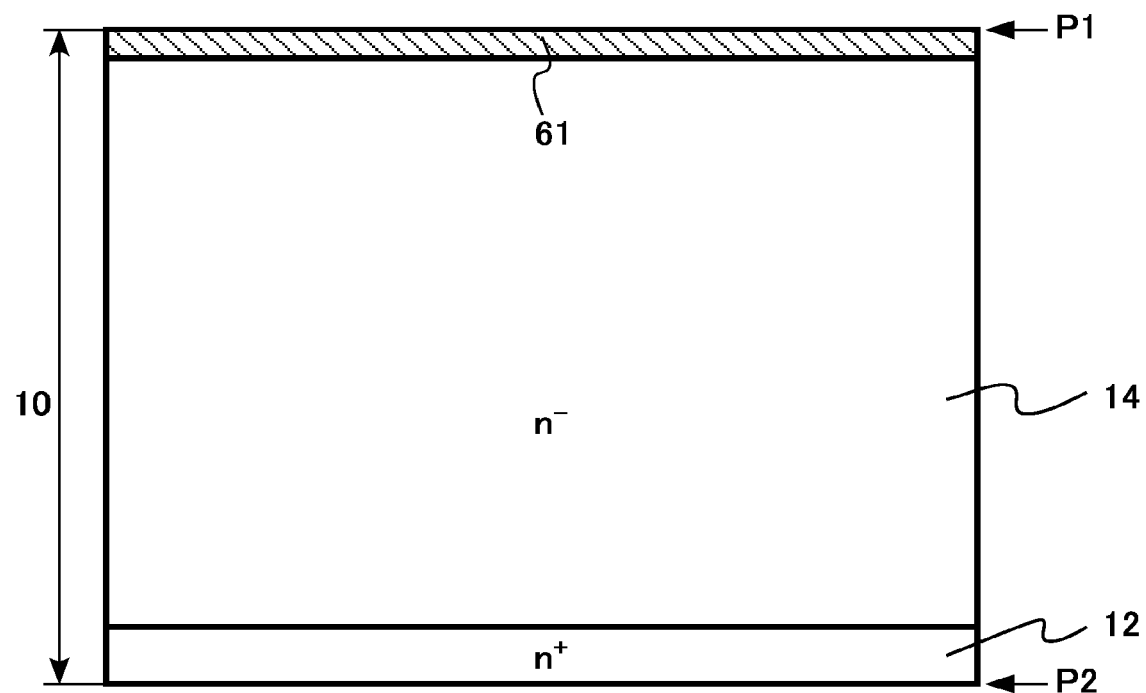
FIG. 7 is a schematic sectional view illustrating the semiconductor device in the middle of manufacturing in the method of manufacturing the semiconductor device of the first embodiment.

FIGS. 5, 6, and 7 are schematic sectional views illustrating the semiconductor device in the middle of manufacturing in the method of manufacturing the semiconductor device of the first embodiment.

First, an $n^+$-type silicon carbide substrate having the first plane P1 (front surface) that is the silicon face and the second plane P2 (back surface) that is the carbon face is prepared. The silicon carbide substrate corresponds to the cathode region 12 of the silicon carbide layer 10. Next, the $n^-$-type drift region 14 is formed on the silicon carbide substrate by an epitaxial growth method (FIG. 5).

Next, a thermal oxide film 50 is formed on the front surface P1 of the silicon carbide layer 10 (FIG. 6). Next, the thermal oxide film 50 is removed. The thermal oxide film 50 is a so-called sacrificial oxide film. For example, the front surface P1 of the silicon carbide layer 10 is cleaned by formation and removal of the sacrificial oxide film.

Next, the first heat treatment is performed at a temperature between 1300° C. and 1500° C. in an $N_2$ gas with an oxygen partial pressure of 0.1 ppm or less, for the silicon carbide layer 10 where the front surface P1 is exposed (FIG. 7). The first nitrogen region 61 is formed in the silicon carbide layer 10 by the first heat treatment. In the first nitrogen region 61, the VcNN structure is formed.

Subsequently, the anode electrode 34 and the cathode electrode 36 are formed by a known process, and the SBD 100 of the first embodiment illustrated in FIG. 1 is manufactured.

Hereinafter, functions and effects of the semiconductor device and the method of manufacturing the semiconductor device according to the first embodiment will be described.

In the case of forming an SBD using silicon carbide, there is a problem that a Schottky barrier height becomes unstable. A breakdown voltage of the SBD is decreased as the Schottky barrier height is decreased, for example. Further, the breakdown voltage of the SBD varies if the Schottky barrier height varies among chips, for example. Further, a forward voltage (VF) varies if the Schottky barrier height varies among the chips, for example. Further, current concentration to a partial region occurs and the SBD may be destroyed if the Schottky barrier height varies within an electrode of the same chip.

One of reasons why the Schottky barrier height becomes unstable is considered to be the presence of the carbon vacancies Vc in the silicon carbide layer 10. The carbon vacancy Vc is considered to be formed during oxidation of the silicon carbide layer 10, for example.

The SBD 100 of the first embodiment has the VcNN structure on the front surface P1 of the silicon carbide layer 10. With the VcNN structure, the density of the carbon vacancies Vc of the silicon carbide layer 10 is reduced. Therefore, the Schottky barrier height of the SBD 100 is stabilized. Details will be described below.

Figure 8A:
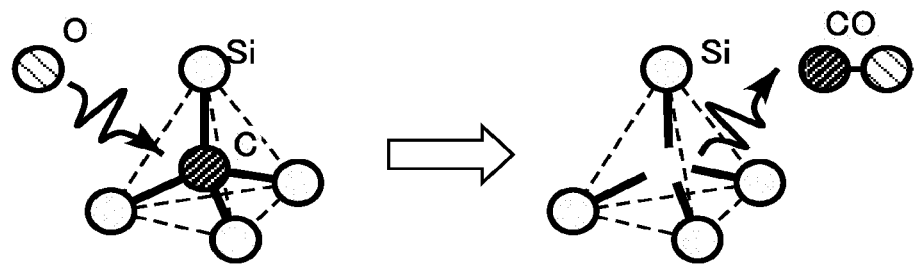
FIGS. 8A, 8B, and 8C are explanatory diagrams of functions of the semiconductor device and the method of manufacturing the semiconductor device according to the first embodiment.
Figure 8B:
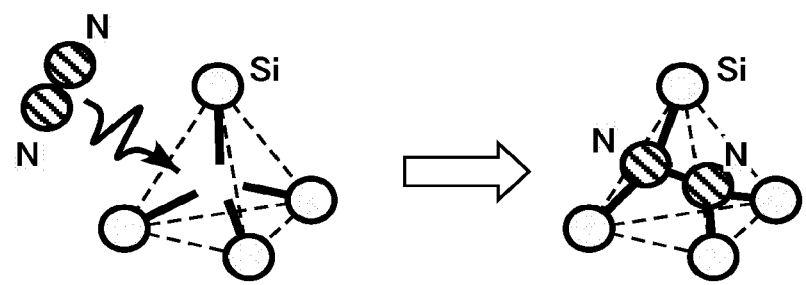
Figure 8C:
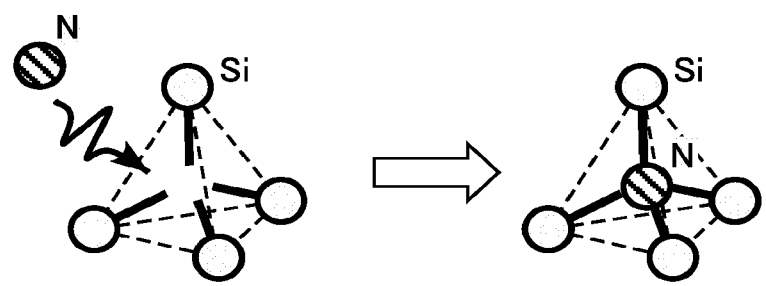

FIGS. 8A, 8B, and 8C are explanatory diagrams of functions of the semiconductor device and the method of manufacturing the semiconductor device according to the first embodiment. FIG. 8A is an explanatory diagram of the carbon vacancy Vc, FIG. 8B is an explanatory diagram of the VcNN structure, and FIG. 8C is an explanatory diagram of a VcN structure. Note that the VcN structure is a structure in which one nitrogen atom is contained in the carbon vacancy Vc of the silicon carbide lattice.

For example, it is assumed that oxygen (O) is supplied into the silicon carbide layer 10 during oxidation from the front surface of the silicon carbide layer 10. In this case, carbon (C) in the silicon carbide lattice is bonded to oxygen to generate carbon monoxide (CO). As a result, the carbon vacancy Vc is formed (FIG. 8A). The carbon vacancy Vc is also formed by ion implantation of impurities, for example, other than by supply of oxygen.

As a result of first principle calculation, it has become clear that the VcNN structure containing two nitrogen atoms in the carbon vacany Vc stably exists. Then, it has become clear that it is desirable to supply $N_2$ molecules in an excited state to the silicon carbide layer 10 where the carbon vacancy Vc exists in order to form the VcNN structure (FIG. 8B). That is, it has become clear that the VcNN structure can be formed from a state where a pair of nitrogen atoms is excited and coexist with the carbon vacancy Vc. Specifically, the VcNN structure is formed by performing heat treatment in a high-temperature $N_2$ gas atmosphere.

For example, in nitrogen plasma treatment, nitrogen is excited as one atom, and thus no VcNN structure is formed and the VcN structure is formed (FIG. 8C).

Figure 9:
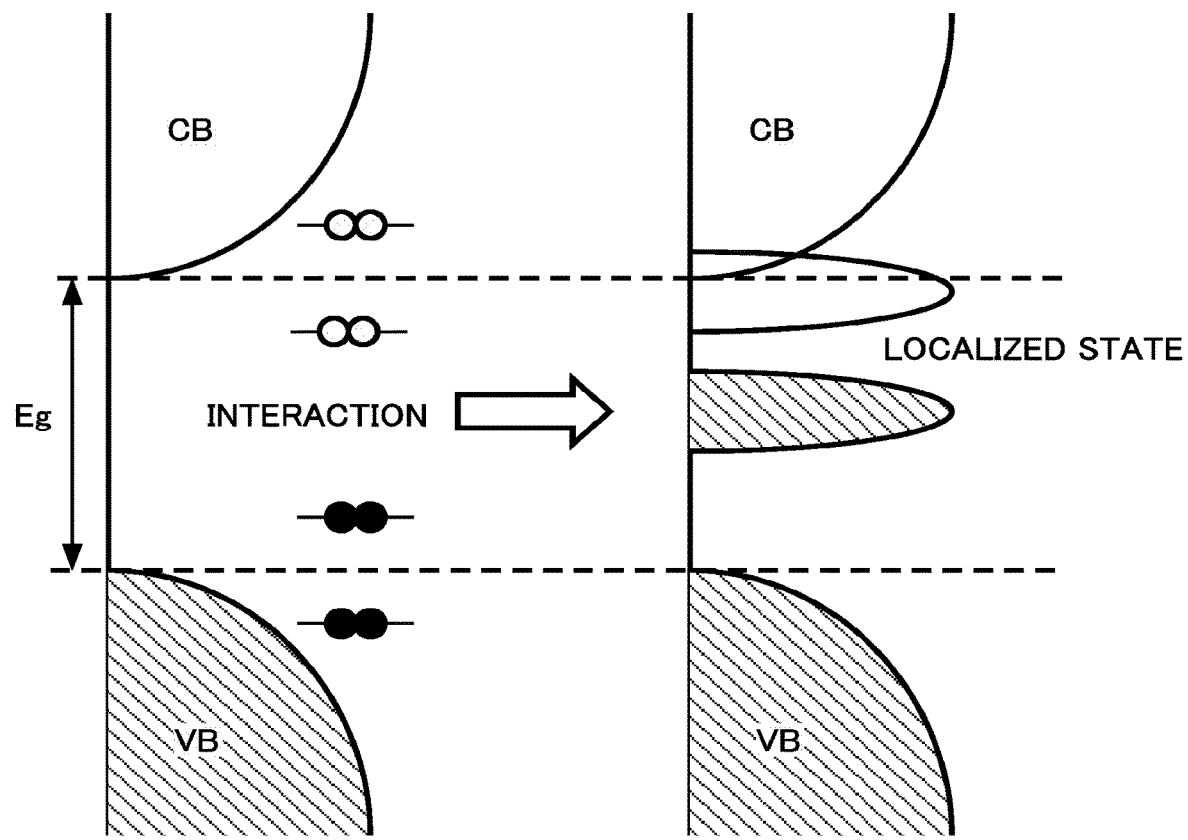
FIG. 9 is an explanatory diagram of functions of the semiconductor device and the method of manufacturing the semiconductor device according to the first embodiment.

FIG. 9 is an explanatory diagram of functions of the semiconductor device and the method of manufacturing the semiconductor device according to the first embodiment. FIG. 9 is an explanatory diagram of an electronic state of the carbon vacancy Vc. FIG. 9 illustrates a band diagram of silicon carbide in the presence of the carbon vacancy Vc.

Four silicon dangling bonds are formed by the carbon vacancy Vc, and as illustrated in the left diagram of FIG. 9, each forms an energy level. Note that the black circle indicates a state in which the energy level is filled with electrons, and the open circle indicates a state in which the energy level is not filled with electrons. Localized states are formed in a band gap and at a lower end of a conduction band CB by interaction of the energy levels, as illustrated in the right diagram.

The localized state at the lower end of the conduction band CB acts as a trap of electrons. Therefore, Fermi level pinning occurs, and the barrier of carriers between the anode electrode 34 and the drift region 14 becomes low. Therefore, the Schottky barrier of the SBD 100 is lowered. If the density of the carbon vacancies Vc in the silicon carbide layer 10 varies, the Schottky barrier of the SBD 100 unstably varies.

Figure 10A:
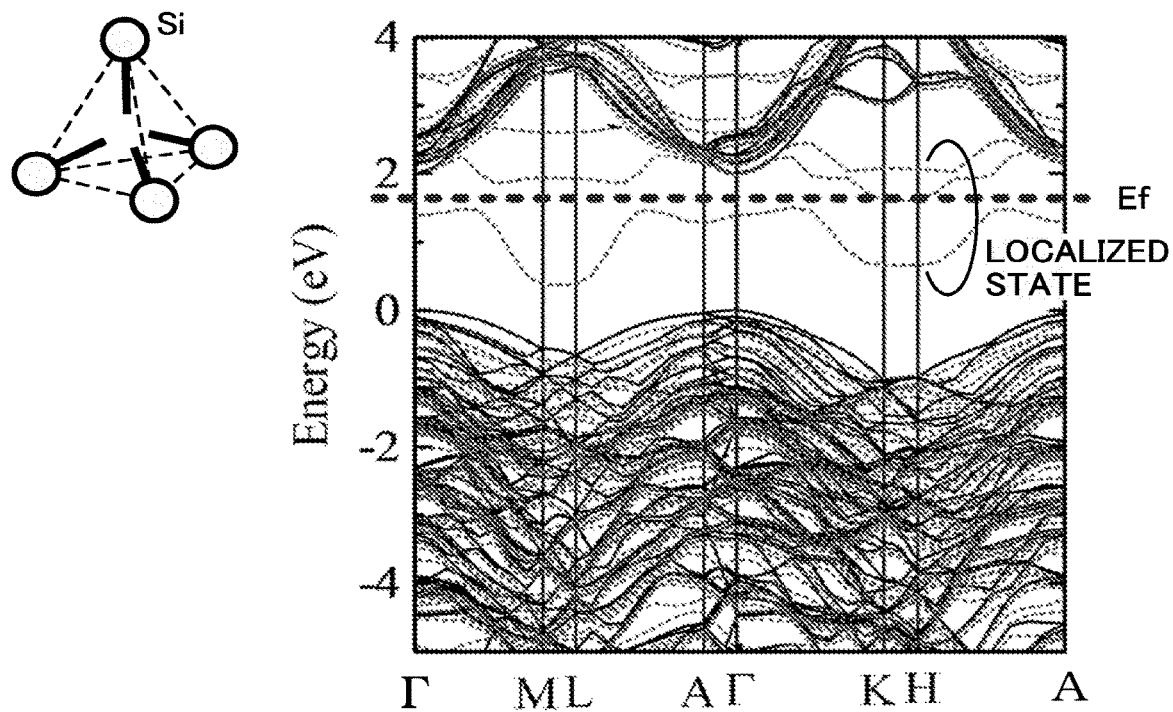
FIGS. 10A and 10B are explanatory diagrams of functions of the semiconductor device and the method of manufacturing the semiconductor device according to the first embodiment.
Figure 10B:
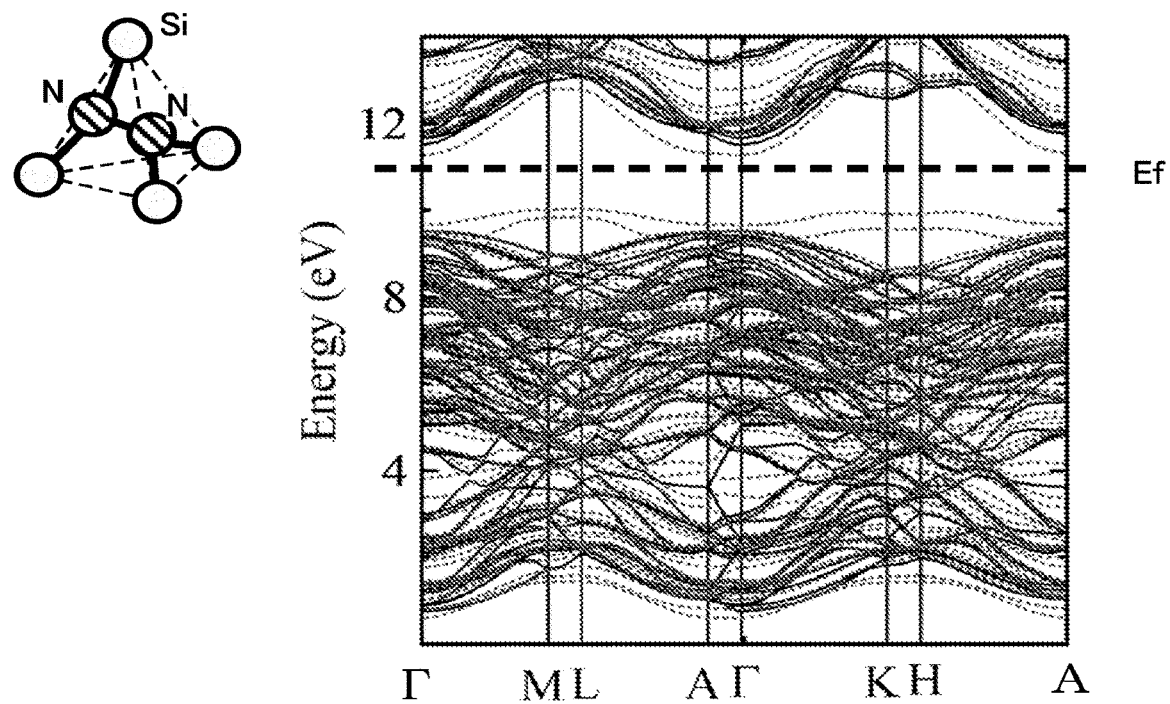

FIGS. 10A and 10B are explanatory diagrams of functions of the semiconductor device and the method of manufacturing the semiconductor device according to the first embodiment. FIG. 10A is a band diagram in the presence of the carbon vacancy Vc in the silicon carbide lattice, and FIG. 10B is a band diagram in the case where there is the VcNN structure in the silicon carbide lattice. FIG. 10A and FIG. 10B are simulation results.

As illustrated in FIG. 10A, it is found that the localized states are formed in the band gap and at the lower end of the conduction band CB in the presence of the carbon vacancy Vc. In contrast, as illustrated in FIG. 10B, the localized state disappears in the case where there is the VcNN structure.

With the formation of the VcNN structure, the carbon vacancy Vc disappears and the localized states in the band gap and at the lower end of the conduction band CB disappear. Therefore, the decrease in the barrier of carriers between the anode electrode 34 and the drift region 14 is suppressed. Therefore, the SBD 100 in which the Schottky barrier height is stabilized is realized.

In the case where the VcN structure illustrated in FIG. 8C is formed instead of the VcNN structure, the VcN structure acts as a donor. Therefore, the barrier of carriers between the anode electrode 34 and the drift region 14 is decreased. Therefore, a problem that the Schottky barrier of the SBD 100 is lowered is caused.

The nitrogen concentration (first nitrogen concentration) of the first nitrogen region 61 is favorably equal to or higher than $1\times10^{17}$ cm$^{-3}$ and equal to or lower than $1\times10^{22}$ cm$^{-3}$. The Schottky barrier height may not be stabilized if the nitrogen concentration goes below the range. Further, exceeding the above range is difficult in manufacturing.

In the manufacturing method of the first embodiment, second heat treatment is performed at from 1300° C. to 1500° C. The excitation of N$_2$ molecules becomes insufficient and the VcNN structure is not formed if the temperature goes below the range. Meanwhile, the N$_2$ molecules are separated and become single nitrogen atoms, and the VcNN structure is not formed if the temperature exceeds the range.

In the manufacturing method of the first embodiment, the oxygen partial pressure of the heat treatment for forming the VcNN structure is desirably as low as possible. If oxygen exists during the heat treatment, oxidation of the front surface of the silicon carbide layer 10 proceeds and the VcNN structure may not be able to be sufficiently formed. The oxygen partial pressure is 0.1 ppm or less, preferably 0.01 ppm or less.

In the manufacturing method of the first embodiment, high-temperature annealing is performed in the N$_2$ gas in a state where the front surface P1 of the silicon carbide layer 10 is exposed. As a result, penetration of the excited N$_2$ molecules into the silicon carbide layer 10 is facilitated. Therefore, the carbon vacancy Vc in the silicon carbide layer 10 can be changed to the VcNN structure.

In the manufacturing method of the first embodiment, the total pressure during the heat treatment is favorably higher than the atmospheric pressure from the viewpoint of forming the VcNN structure in the silicon carbide layer 10. By making the total pressure higher than the atmospheric pressure, penetration of the excited N$_2$ molecules into the silicon carbide layer 10 is facilitated.

As described above, according to the first embodiment, the SBD 100 in which the carbon vacancy Vc is reduced and the Schottky barrier height is stabilized is realized by the formation of the VcNN structure.

Second Embodiment

A semiconductor device according to a second embodiment is different from the first embodiment in including a first p-type silicon carbide region disposed in the silicon carbide layer, and the first p-type silicon carbide region disposed between the first n-type silicon carbide region and the first electrode; a second p-type silicon carbide region disposed in the silicon carbide layer, the second p-type silicon carbide region disposed between the first n-type silicon carbide region and the first electrode, and the second p-type silicon carbide region separated from the first p-type silicon carbide region; a second nitrogen region disposed in the silicon carbide layer, the second nitrogen region disposed between the first p-type silicon carbide region and the first electrode, and the second nitrogen region having a second nitrogen concentration higher than the first n-type impurity concentration; and a third nitrogen region disposed in the silicon carbide layer, the third nitrogen region disposed between the second p-type silicon carbide region and the first electrode, and the third nitrogen region having a third nitrogen concentration higher than the first n-type impurity concentration. Hereinafter, description of content overlapping with the first embodiment will be partially omitted.

Figure 11:
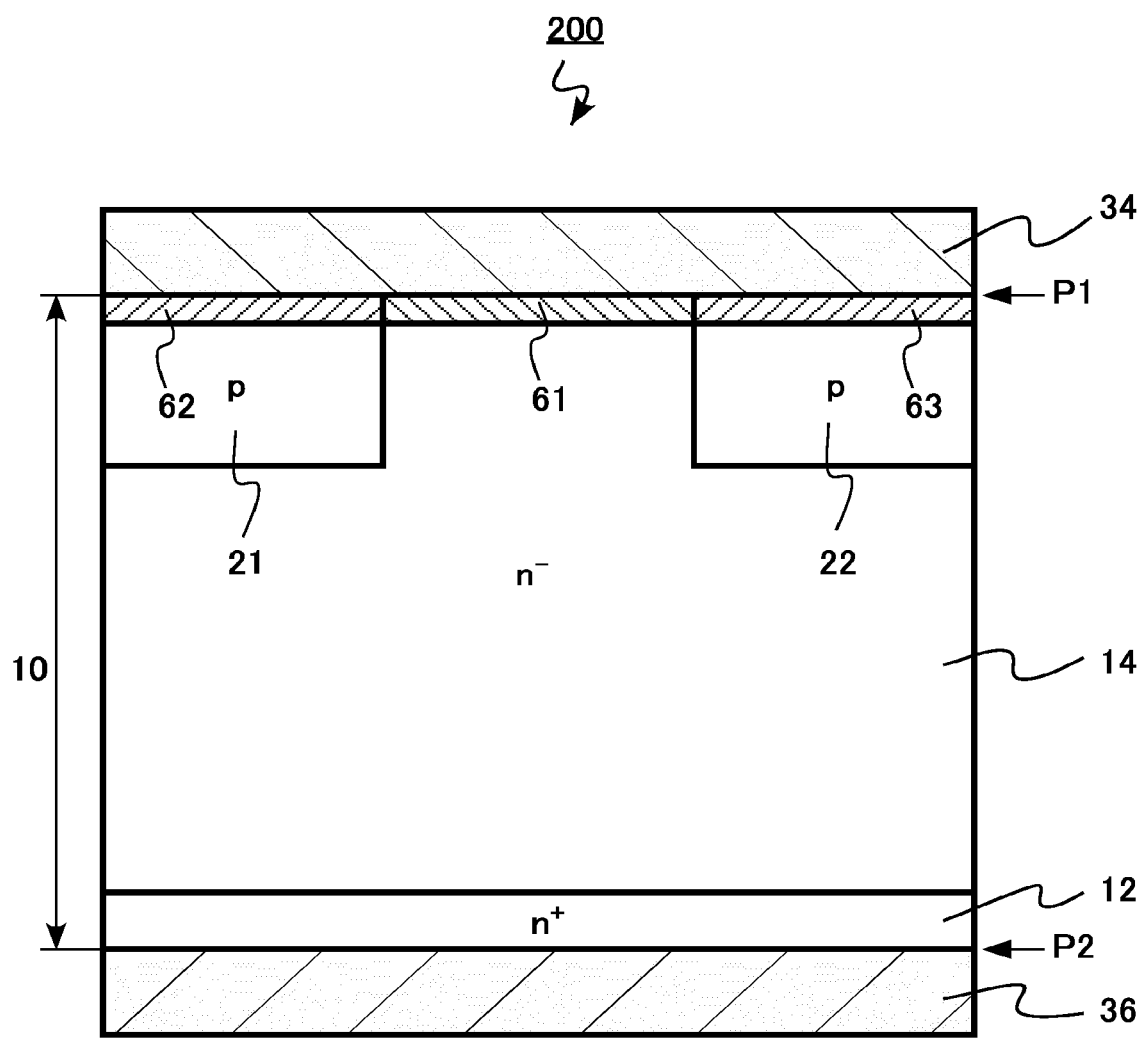
FIG. 11 is a schematic sectional view of a semiconductor device according to a second embodiment.

FIG. 11 is a schematic sectional view of the semiconductor device according to the second embodiment. The semiconductor device of the second embodiment is an merged PiN Schottky diode (MPS) diode 200. The MPS diode 200 has a structure in which an SBD is sandwiched between PiN diodes.

The MPS diode 200 includes a silicon carbide layer 10, a cathode region 12 (second n-type silicon carbide region), a drift region 14 (first n-type silicon carbide region), a first anode region 21 (first p-type silicon carbide region), a second anode region 22 (second p-type silicon carbide region), an anode electrode 34 (first electrode), a cathode electrode 36 (second electrode), a first nitrogen region 61, a second nitrogen region 62, and a third nitrogen region 63. The cathode region 12, the drift region 14, the first anode region 21, the second anode region 22, the first nitrogen region 61, the second nitrogen region 62, and the third nitrogen region 63 are formed in the silicon carbide layer 10.

The silicon carbide layer 10 is single-crystal SiC. The silicon carbide layer 10 is, for example, 4H—SiC.

The first anode region 21 is p-type SiC. The first anode region 21 is provided between the drift region 14 and the anode electrode 34. The first anode region 21 is provided on a front surface of the drift region 14.

The first anode region 21 contains, for example, aluminum (Al) as a p-type impurity. An impurity concentration of the p-type impurity of the first anode region 21 is, for example, equal to or higher than $1\times10^{17}$ cm$^{-3}$ and equal to or lower than $1\times10^{22}$ cm$^{-3}$. The depth of the first anode region 21 is, for example, from 0.5 µm to 2.0 µm.

The second anode region 22 is p-type SiC. The second anode region 22 is provided between the drift region 14 and the anode electrode 34. The second anode region 22 is provided on the front surface of the drift region 14. The second anode region 22 is provided separated from the first anode region 21.

The second anode region 22 contains, for example, aluminum (Al) as a p-type impurity. An impurity concentration of the p-type impurity of the second anode region 22 is, for example, equal to or higher than $1\times10^{17}$ cm$^{-3}$ and equal to or lower than $1\times10^{22}$ cm$^{-3}$. The depth of the second anode region 22 is, for example, from 0.5 µm to 2.0 µm.

The second nitrogen region 62 is provided in the silicon carbide layer 10. The second nitrogen region 62 is provided between the first anode region 21 and the anode electrode 34. The second nitrogen region 62 is provided adjacent to the anode electrode 34. The second nitrogen region 62 is in contact with the anode electrode 34.

The second nitrogen region 62 is provided adjacent to the front surface P1 of the silicon carbide layer 10. The second nitrogen region 62 is in contact with the front surface P1 of the silicon carbide layer 10.

The second nitrogen region 62 contains nitrogen (N). The second nitrogen region 62 is p-type silicon carbide containing nitrogen (N).

A nitrogen concentration (second nitrogen concentration) of the second nitrogen region 62 is higher than an impurity concentration of an n-type impurity (first n-type impurity concentration) of the drift region 14. For example, in the case where the n-type impurity of the drift region 14 is nitrogen, the nitrogen concentration of the second nitrogen region 62 is higher than a nitrogen concentration of the drift region 14.

The nitrogen concentration (second nitrogen concentration) of the second nitrogen region 62 is, for example, equal to or higher than $1\times10^{18}$ cm$^{-3}$ and equal to or lower than $5\times10^{22}$ cm$^{-3}$.

The second nitrogen region 62 has a VcNN structure. Since the second nitrogen region 62 has the VcNN structure, the density of carbon vacancies Vc of the silicon carbide layer 10 is reduced. Note that nitrogen in the VcNN structure does not function as a dopant. The nitrogen in the VcNN structure is inert nitrogen.

The third nitrogen region 63 is provided in the silicon carbide layer 10. The third nitrogen region 63 is provided between the second anode region 22 and the anode electrode 34. The third nitrogen region 63 is provided adjacent to the anode electrode 34. The third nitrogen region 63 is in contact with the anode electrode 34.

The third nitrogen region 63 is provided adjacent to the front surface P1 of the silicon carbide layer 10. The third nitrogen region 63 is in contact with the front surface P1 of the silicon carbide layer 10.

The third nitrogen region 63 contains nitrogen (N). The third nitrogen region 63 is p-type silicon carbide containing nitrogen (N).

A nitrogen concentration (third nitrogen concentration) of the third nitrogen region 63 is higher than the impurity concentration of the n-type impurity (first n-type impurity concentration) of the drift region 14. For example, in the case where the n-type impurity of the drift region 14 is nitrogen, the nitrogen concentration of the third nitrogen region 63 is higher than the nitrogen concentration of the drift region 14.

The nitrogen concentration (third nitrogen concentration) of the third nitrogen region 63 is, for example, equal to or higher than $1\times10^{18}$ cm$^{-3}$ and equal to or lower than $5\times10^{22}$ cm$^{-3}$.

The third nitrogen region 63 has a VcNN structure. Since the third nitrogen region 63 has the VcNN structure, the density of carbon vacancies Vc of the silicon carbide layer 10 is reduced. Note that nitrogen in the VcNN structure does not function as a dopant. The nitrogen in the VcNN structure is inert nitrogen.

The anode electrode 34 is electrically connected to the drift region 14, the first anode region 21, and the second anode region 22. The anode electrode 34 is provided on the side of the front surface P1 of the silicon carbide layer 10. The anode electrode 34 is in contact with the silicon carbide layer 10.

The anode electrode 34 is in contact with the first nitrogen region 61, the second nitrogen region 62, and the third nitrogen region 63. The junction between the anode electrode 34 and the first nitrogen region 61 is a Schottky junction. The junction between the anode electrode 34 and the second nitrogen region 62 is an ohmic junction. The junction between the anode electrode 34 and the third nitrogen region 63 is an ohmic junction.

The anode electrode 34 is, for example, a metal or a metal compound. The anode electrode 34 is constituted by, for example, lamination of a barrier metal layer of Ni (nickel) and a metal layer of aluminum on the barrier metal layer. The barrier metal layer of nickel and the silicon carbide layer 10 may react to form nickel silicide (NiSi, Ni$_2$Si, or the like). The barrier metal layer of nickel and the metal layer of aluminum may form an alloy by reaction.

The cathode electrode 36 is electrically connected to the cathode region 12. The cathode electrode 36 is provided on the side of the back surface P2 of the silicon carbide layer 10. The cathode electrode 36 is in contact with the silicon carbide layer 10.

The cathode electrode 36 is in contact with the cathode region 12. The junction between the cathode electrode 36 and the cathode region 12 is an ohmic junction.

Next, a method of manufacturing a semiconductor device of the second embodiment will be described.

The method of manufacturing a semiconductor device according to the second embodiment is different from the first embodiment in performing ion implantation of a p-type impurity from a side of a first plane before first heat treatment to form a first p-type silicon carbide region and a second p-type silicon carbide region separated from the first p-type silicon carbide region, performing second heat treatment at a temperature between 1650° C. and 1900° C. and performing the first heat treatment after the second heat treatment. Hereinafter, description of content overlapping with the first embodiment will be partially omitted.

FIGS. 12, 13, 14, 15, and 16 are schematic sectional views illustrating the semiconductor device in the middle of manufacturing in the method of manufacturing the semiconductor device of the second embodiment.

Figure 12:
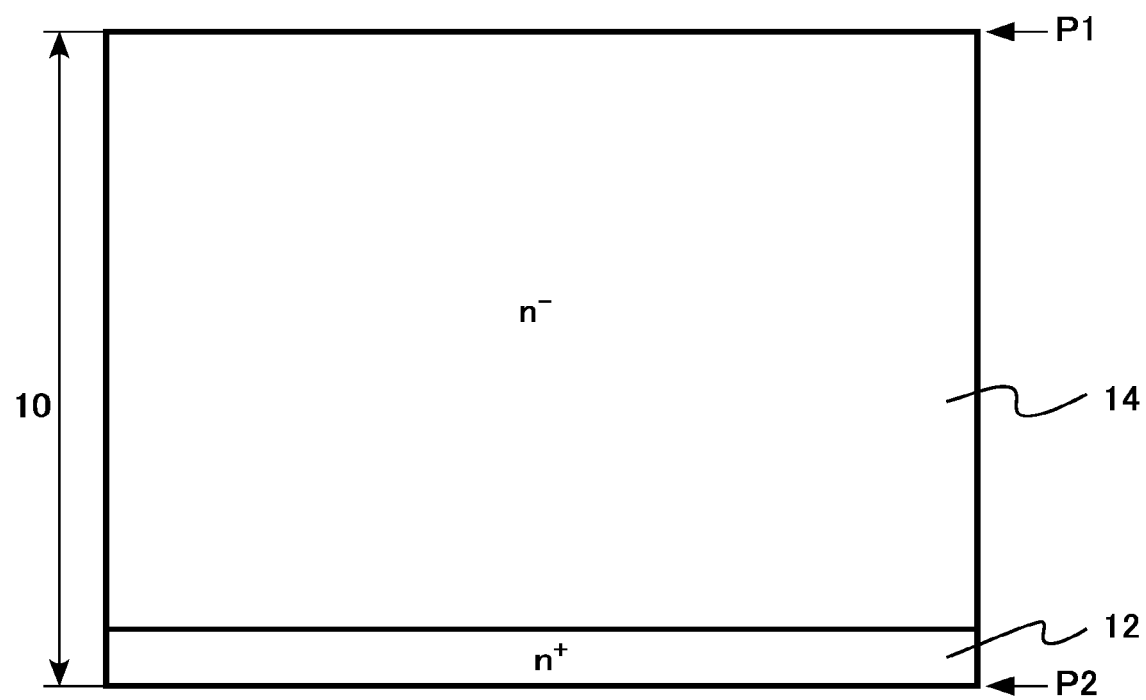
FIG. 12 is a schematic sectional view illustrating the semiconductor device in the middle of manufacturing in a method of manufacturing the semiconductor device of the second embodiment.

First, an n$^+$-type silicon carbide substrate having the first plane P1 (front surface) that is the silicon face and the second plane P2 (back surface) that is the carbon face is prepared. The silicon carbide substrate corresponds to the cathode region 12 of the silicon carbide layer 10. Next, an n⁻-type drift region 14 is formed on the silicon carbide substrate by epitaxial growth method (FIG. 12).

Figure 13:
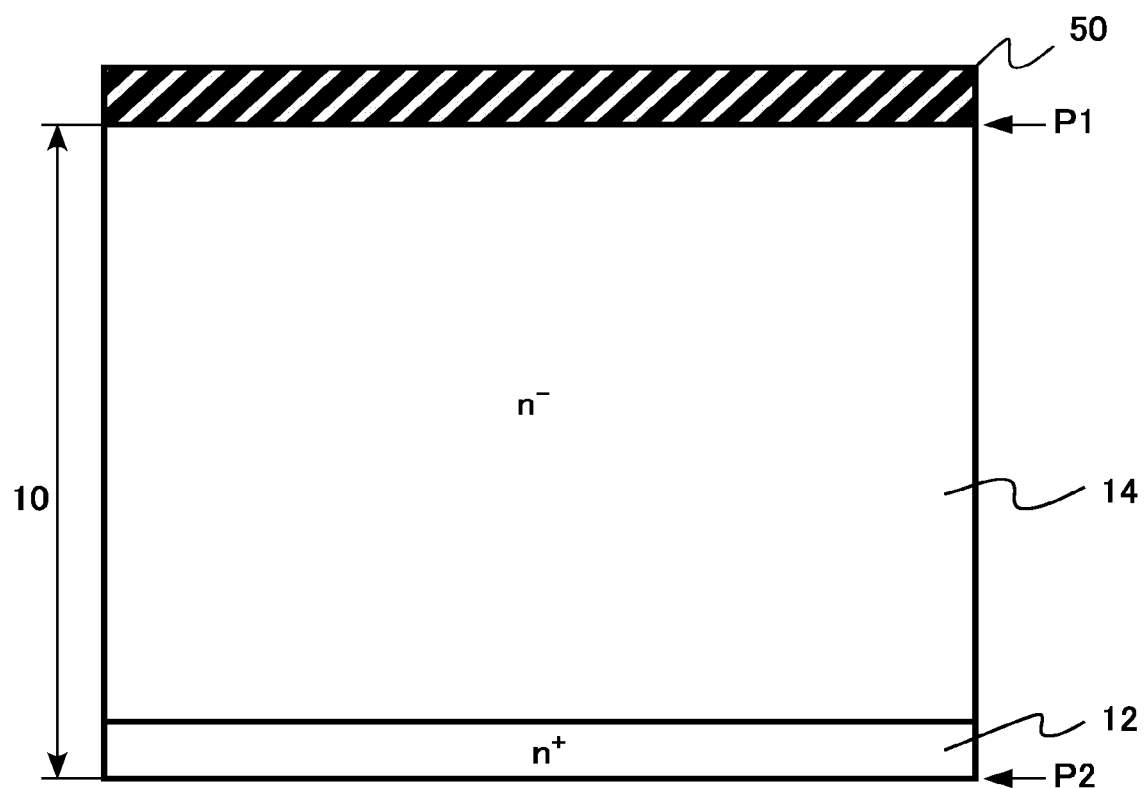
FIG. 13 is a schematic sectional view illustrating the semiconductor device in the middle of manufacturing in the method of manufacturing the semiconductor device of the second embodiment.

Next, a thermal oxide film 50 is formed on the front surface P1 of the silicon carbide layer 10 (FIG. 13). Next, the thermal oxide film 50 is removed. The thermal oxide film 50 is a so-called sacrificial oxide film. For example, the front surface P1 of the silicon carbide layer 10 is cleaned by formation and removal of the sacrificial oxide film.

Figure 14:
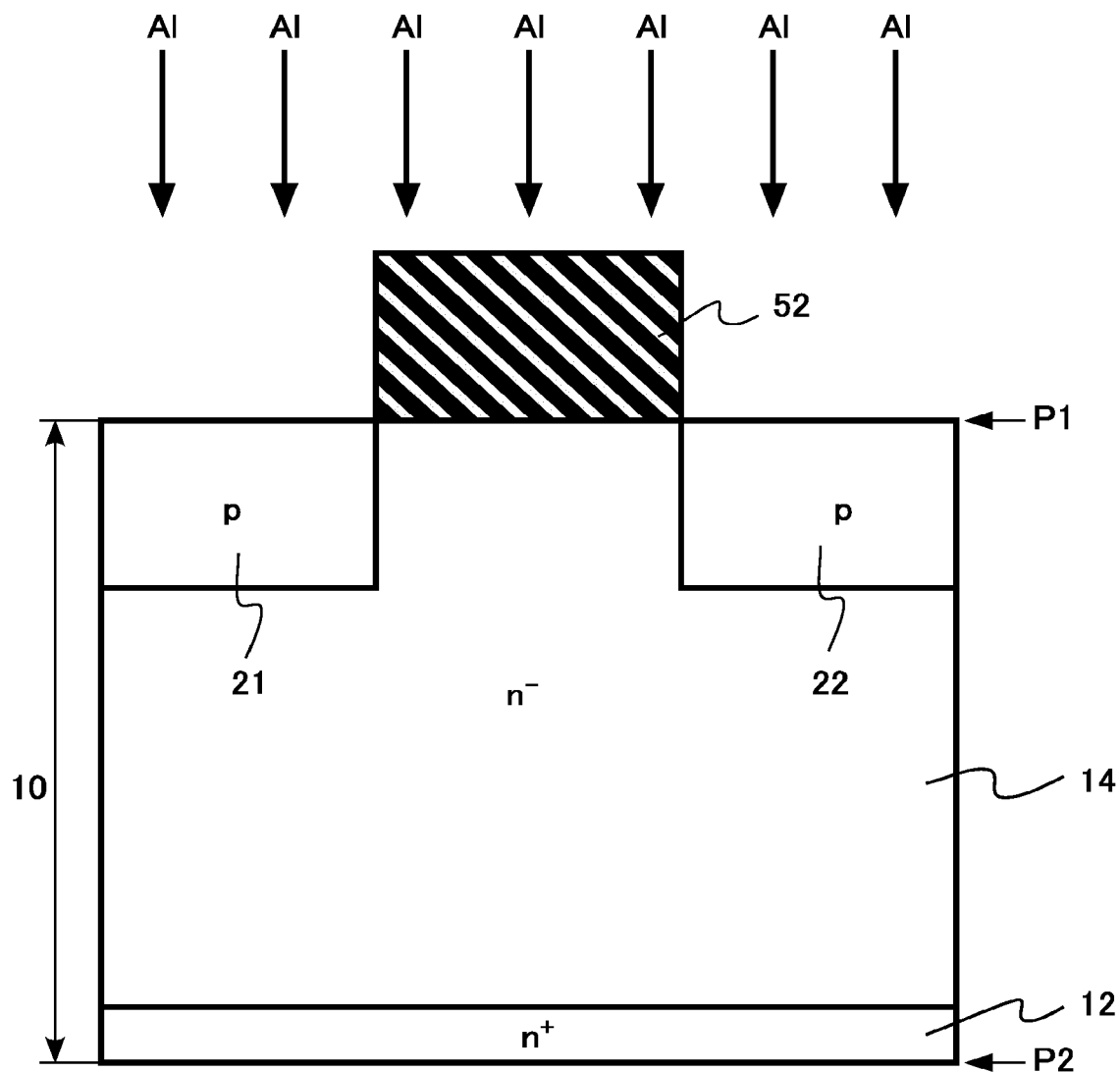
FIG. 14 is a schematic sectional view illustrating the semiconductor device in the middle of manufacturing in the method of manufacturing the semiconductor device of the second embodiment.

Next, a mask material 52 is formed on the front surface P1 of the silicon carbide layer 10. Next, ion implantation is performed using the mask material 52 as a mask to form a p-type first anode region 21 and a p-type second anode region 22 (FIG. 14). Ion implantation of p-type impurities is performed from the front surface P1 side of the silicon carbide layer 10. The p-type impurity is, for example, aluminum (Al).

Figure 15:
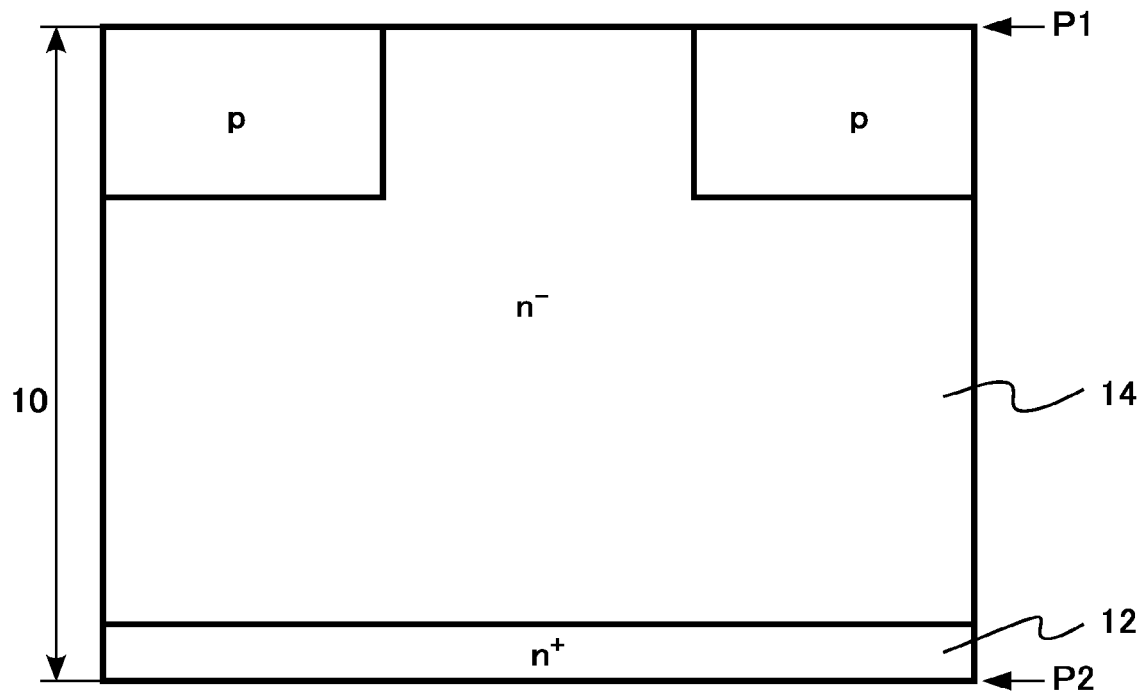
FIG. 15 is a schematic sectional view illustrating the semiconductor device in the middle of manufacturing in the method of manufacturing the semiconductor device of the second embodiment.

Next, the mask material 52 is removed (FIG. 15). Next, a carbon film (not illustrated) is deposited on the front surface P1 of the silicon carbide layer 10. Next, the second heat treatment at a temperature between 1650° C. and 1900° C. is performed. The carbon film prevents silicon from being detached from the front surface P1 of the silicon carbide layer 10 during the high-temperature second heat treatment.

The p-type impurities of the p-type first anode region 21 and the p-type second anode region 22 are activated by the second heat treatment. The second heat treatment is performed, for example, in an argon atmosphere.

Next, the carbon film is removed. Subsequently, a surface film (not illustrated) on the front surface P1 of the silicon carbide layer 10 is removed by wet etching, for example. The surface film is a film containing oxygen. The surface film is, for example, an oxide film formed by residual oxygen during the second heat treatment.

Figure 16:
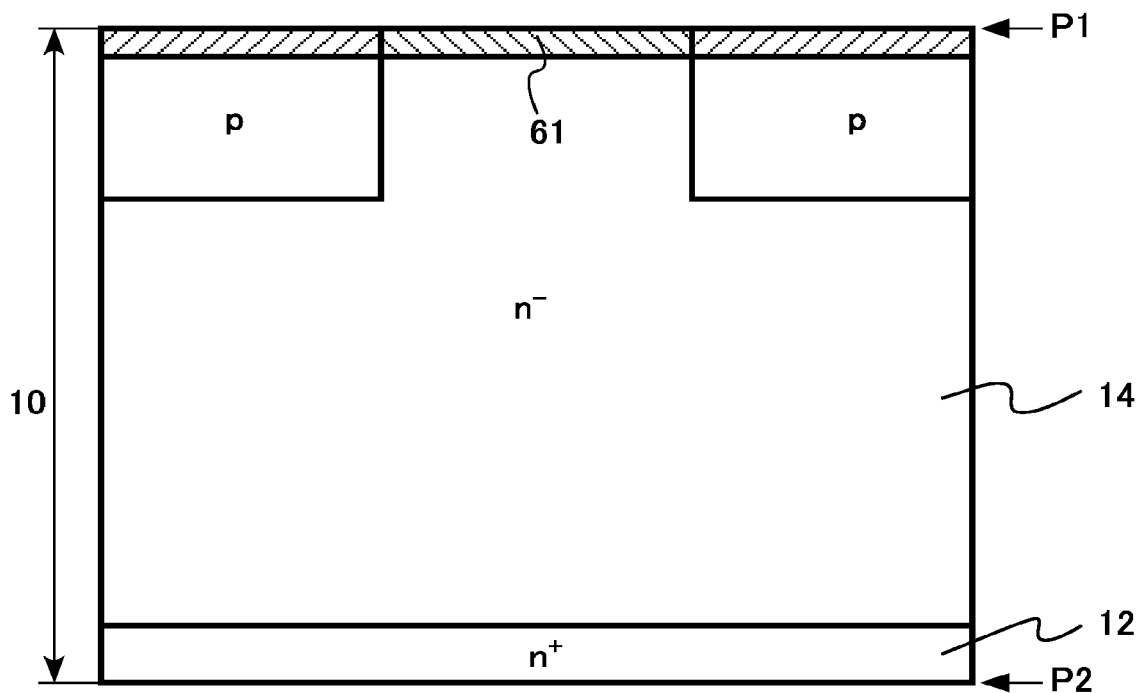
FIG. 16 is a schematic sectional view illustrating the semiconductor device in the middle of manufacturing in the method of manufacturing the semiconductor device of the second embodiment.

Next, the first heat treatment is performed at from 1300° C. to 1500° C. in an $N_2$ gas with an oxygen partial pressure of 0.1 ppm or less, for the silicon carbide layer 10 where the front surface P1 is exposed (FIG. 16). The first nitrogen region 61, the second nitrogen region 62, and the third nitrogen region 63 are formed in the silicon carbide layer 10 by the first heat treatment. The VcNN structure is formed in the first nitrogen region 61, the second nitrogen region 62, and the third nitrogen region 63.

Subsequently, the anode electrode 34 and the cathode electrode 36 are formed by a known process, and the MPS diode 200 of the second embodiment illustrated in FIG. 11 is manufactured.

Hereinafter, functions and effects of the semiconductor device and the method of manufacturing the semiconductor device according to the second embodiment will be described.

In the case of forming an MPS diode using silicon carbide, there is a problem that on-resistance is high. One of the reasons why the on-resistance is high is considered to be the presence of carbon vacancies Vc in the p-type anode region. The carbon vacancy Vc is considered to be formed by damage by the ion implantation of p-type impurities when forming the anode region, for example.

The MPS diode 200 of the second embodiment has the VcNN structure in the silicon carbide layer 10. With the VcNN structure, the density of the carbon vacancies Vc of the silicon carbide layer 10 is reduced. Therefore, the on-resistance of the MPS diode 200 is reduced. Details will be described below.

As described in the first embodiment, localized state is formed at a lower end of a conduction band CB by the carbon vacancy Vc. The localized state at the lower end of the conduction band CB acts as a trap of electrons. Therefore, Fermi level pinning occurs, and the barrier of carriers between the anode electrode 34 and the p-type first anode region 21, the anode electrode 34 and the p-type second anode region 22 becomes high. Therefore, contact resistance of the anode electrode 34 may become large. The on-resistance of the MPS diode 200 becomes high as the contact resistance of the anode electrode 34 becomes large. Further, due to formation of the barrier of holes, hole injection and extinction takes time, and a switching loss becomes large.

In the MPS diode 200 of the second embodiment, the carbon vacancy Vc disappears and the localized state at the lower end of the conduction band CB disappear with the formation of the VcNN structure. Therefore, the contact resistance of the anode electrode 34 becomes small. Therefore, the MPS diode 200 with low on-resistance is realized.

The second nitrogen concentration of the second nitrogen region 62 and the third nitrogen concentration of the third nitrogen region 63 are favorably, for example, equal to or higher than $1 \times 10^{18}$ cm$^{-3}$ and equal to or lower than $5 \times 10^{22}$ cm$^{-3}$. The contact resistance of the anode electrode 34 may not be sufficiently lowered if the nitrogen concentration goes below the range. Further, exceeding the above range is difficult in manufacturing.

Note that the Schottky barrier height between the anode electrode 34 and the first nitrogen region 61 being stabilized is similar to the first embodiment.

As described above, according to the second embodiment, the MPS diode 200 in which the carbon vacancy Vc is reduced, the Schottky barrier height is stabilized, and the on-resistance is reduced, and the method of manufacturing the MPS diode 200, are realized by the formation of the VcNN structure.

As described above, in the first and second embodiments, the case of 4H—SiC has been described as an example of the crystal structure of silicon carbide. However, the present disclosure can be applied to silicon carbide with other crystal structures such as 6H—SiC and 3C—SiC.

In the first and second embodiments, the n-type impurity is favorably, for example, nitrogen (N) or phosphorus (P). However, arsenic (As) or antimony (Sb) is also applicable. Further, the p-type impurity is favorably, for example, aluminum (Al). However, boron (B), gallium (Ga), or indium (In) is also applicable.

While certain embodiments have been described, these embodiments have been presented by way of example only, and are not intended to limit the scope of the inventions. Indeed, a semiconductor device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a Schottky barrier diode including:
     a first electrode;
     a second electrode;
     a silicon carbide layer disposed between the first electrode and the second electrode, the silicon carbide layer being in direct contact with the first electrode;
     a first n-type silicon carbide region disposed in the silicon carbide layer; and
     a first nitrogen region disposed in the silicon carbide layer, the first nitrogen region disposed between the first n-type silicon carbide region and the first electrode, and the first nitrogen region having a first nitrogen concentration higher than a first n-type impurity concentration of the first n-type silicon carbide region.

2. The device according to claim 1, wherein the first nitrogen region is adjacent to the first electrode.

3. The device according to claim 1, wherein an n-type impurity contained in the first n-type silicon carbide region is nitrogen.

4. The device according to claim 1, wherein the first nitrogen concentration is equal to or higher than $1\times10^{17}$ cm$^{-3}$ and equal to or lower than $1\times10^{22}$ cm$^{-3}$.

5. The device according to claim 1, wherein the first n-type impurity concentration is equal to or higher than $1\times10^{15}$ cm$^{-3}$ and equal to or lower than $2\times10^{16}$ cm$^{-3}$.

6. The device according to claim 1, wherein a junction between the first electrode and the first nitrogen region is a Schottky junction.

7. The device according to claim 1, further comprising:
a second n-type silicon carbide region disposed in the silicon carbide layer, the second n-type silicon carbide region disposed between the first n-type silicon carbide region and the second electrode, and the second n-type silicon carbide region having a second n-type impurity concentration higher than the first n-type impurity concentration, wherein
a junction between the second electrode and the second n-type silicon carbide region is an ohmic junction.

8. The device according to claim 1, wherein the first nitrogen region contains a first nitrogen atom and a second nitrogen atom bonded to the first nitrogen atom, the first nitrogen atom is bonded to two silicon atoms, and the second nitrogen atom is bonded to two silicon atoms.

9. The device according to claim 1, wherein two nitrogen atoms in the first nitrogen region exist at a carbon position of a silicon carbide lattice.

10. The device according to claim 1, wherein the first nitrogen region is n-type silicon carbide.

11. The device according to claim 1, further comprising:
a first p-type silicon carbide region disposed in the silicon carbide layer, and the first p-type silicon carbide region disposed between the first n-type silicon carbide region and the first electrode; and
a second p-type silicon carbide region disposed in the silicon carbide layer, the second p-type silicon carbide region disposed between the first n-type silicon carbide region and the first electrode, and the second p-type silicon carbide region separated from the first p-type silicon carbide region.

12. The device according to claim 11, further comprising:
a second nitrogen region disposed in the silicon carbide layer, the second nitrogen region disposed between the first p-type silicon carbide region and the first electrode, and the second nitrogen region having a second nitrogen concentration higher than the first n-type impurity concentration; and
a third nitrogen region disposed in the silicon carbide layer, the third nitrogen region disposed between the second p-type silicon carbide region and the first electrode, and the third nitrogen region having a third nitrogen concentration higher than the first n-type impurity concentration.

13. The device according to claim 12, wherein the second nitrogen concentration and the third nitrogen concentration are equal to or higher than $1\times10^{18}$ cm$^{-3}$ and equal to or lower than $5\times10^{22}$ cm$^{-3}$.

14. The device according to claim 12, wherein each of the second nitrogen region and the third nitrogen region contain a first nitrogen atom and a second nitrogen atom bonded to the first nitrogen atom, the first nitrogen atom is bonded to two silicon atoms, and the second nitrogen atom is bonded to two silicon atoms.

15. The device according to claim 12, wherein two nitrogen atoms in each of the second nitrogen region and the third nitrogen region exist at a carbon position of a silicon carbide lattice.

16. The device according to claim 11, wherein the second nitrogen region and the third nitrogen region are p-type silicon carbide.

17. The semiconductor device of claim 1, wherein the first n-type silicon carbide region is electrically connected to the second electrode.

* * * * *